United States Patent
Kaneko et al.

(10) Patent No.: US 8,338,718 B2
(45) Date of Patent: Dec. 25, 2012

(54) WIRING BOARD AND METHOD OF MANUFACTURING THE SAME

(75) Inventors: Kentaro Kaneko, Nagano (JP); Hidemi Atobe, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 303 days.

(21) Appl. No.: 12/632,112

(22) Filed: Dec. 7, 2009

(65) Prior Publication Data

US 2010/0147574 A1 Jun. 17, 2010

(30) Foreign Application Priority Data

Dec. 17, 2008 (JP) .................................. 2008-321037

(51) Int. Cl.
*H05K 1/11* (2006.01)
(52) U.S. Cl. .................. 174/267; 174/263; 361/760
(58) Field of Classification Search .................. 361/760; 257/700; 174/263, 267
See application file for complete search history.

(56) References Cited

U.S. PATENT DOCUMENTS

| | | | | |
|---|---|---|---|---|
| 5,169,680 A | * | 12/1992 | Ting et al. | 438/629 |
| 5,929,516 A | * | 7/1999 | Heerman et al. | 257/701 |
| 7,067,907 B2 | * | 6/2006 | Koschmieder et al. | 257/678 |
| 2005/0051903 A1 | * | 3/2005 | Ellsberry et al. | 257/777 |
| 2006/0131730 A1 | | 6/2006 | Nakamura | |

FOREIGN PATENT DOCUMENTS

| JP | 2003-347501 | | 12/2003 |
|---|---|---|---|
| JP | 2006-196860 | A1 | 7/2006 |

OTHER PUBLICATIONS

Japanese Office Action issued on corresponding application No. 2008-321037 mailed Jul. 10, 2012 with English translation (3 pages).

* cited by examiner

*Primary Examiner* — Tuan T Dinh
*Assistant Examiner* — Steven Sawyer
(74) *Attorney, Agent, or Firm* — Kratz, Quintos & Hanson, LLP

(57) ABSTRACT

A wiring board (package) has a structure in which multiple wiring layers are stacked one on top of another with insulating layers each interposed between corresponding two of the wiring layers, and the wiring layers are connected to each other through vias formed in the insulating layers. In the peripheral region around the chip mounting area of the outermost insulating layer on one of both surfaces of the board, a pad is formed in a bump shape to cover a surface of a portion of the outermost insulating layer, the portion being formed to protrude, and a pad whose surface is exposed from the insulating layer is arranged in the chip mounting area. A chip is flip-chip bonded to the pad of the package, and another package is bonded to the bump shaped pad in a peripheral region around the chip (package-on-package bonding).

10 Claims, 12 Drawing Sheets

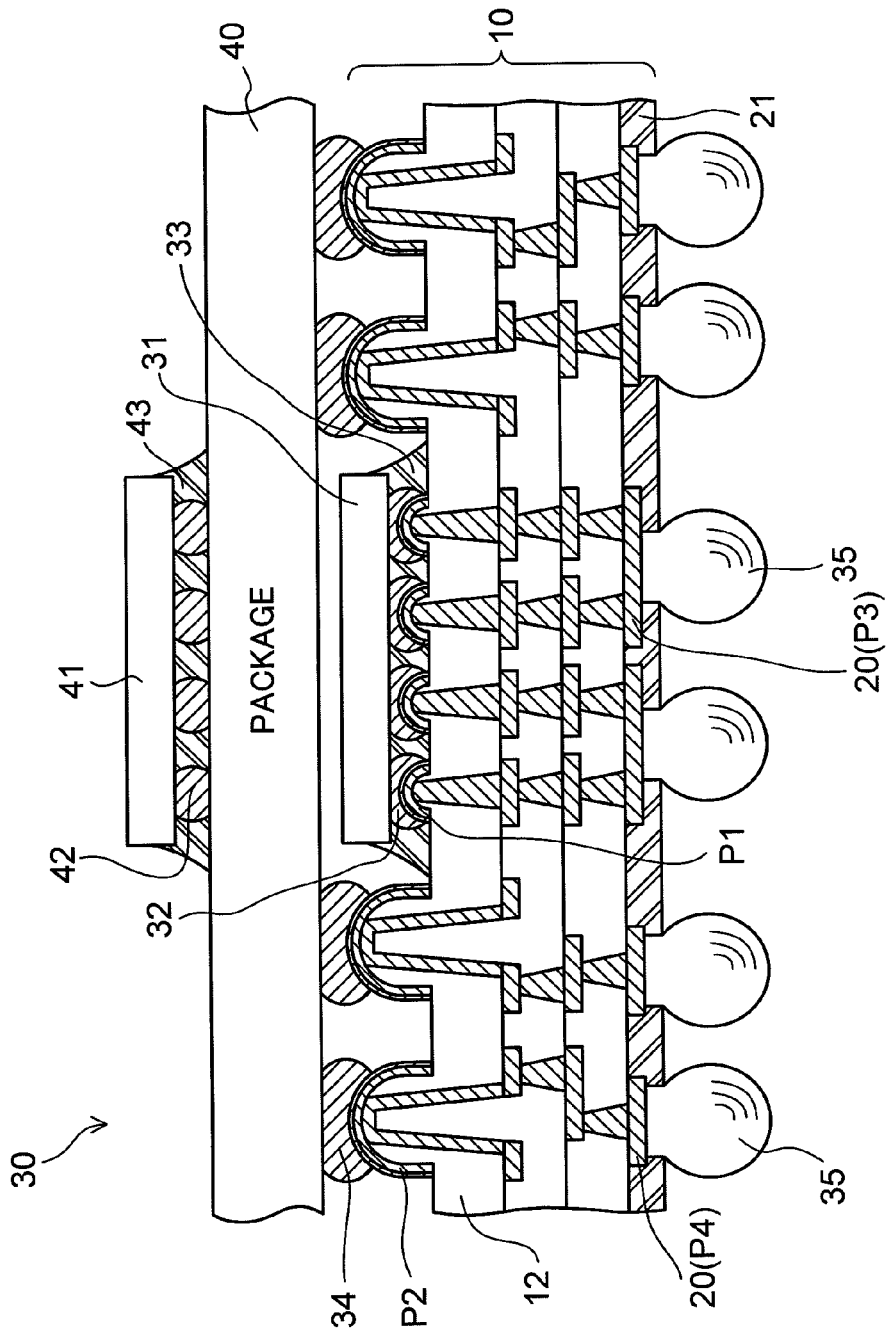

WIRING BOARD AND METHOD OF MANUFACTURING THE SAME

CROSS-REFERENCE TO RELATED APPLICATIONS

This application is based on and claims priority of Japanese Patent Application No. 2008-321037 filed on Dec. 17, 2008, the entire contents of which are incorporated herein by reference.

BACKGROUND OF THE INVENTION (a) Field of the Invention

The present invention relates to a wiring board and a method of manufacturing the same. More specifically, the invention relates to a wiring board having a structure in which terminals (pads) for mounting a semiconductor element (chip) or the like or for external connection are exposed from an outermost insulating layer, and also to a method of manufacturing the same.

The wiring board is also referred to as a "semiconductor package" in the description below, for the sake of convenience, because the wiring board has the role as a package for mounting a semiconductor element (chip) or the like thereon.

(b) Description of the Related Art

In a trend to make semiconductor devices smaller (thinner) in size and higher in performance (higher in functionality), there is a demand for package-on-package (POP) bonding for the purpose of reducing the mounting area of a semiconductor device in which electronic components such as semiconductor chips are mounted on wiring boards (in semiconductor packages). In the POP bonding, packages each including a semiconductor chip or the like mounted thereon are stacked in the vertical direction (height direction) thereof.

As a method of implementing the POP bonding, there is a method in which upper and lower packages are bonded to each other with an interposer placed between the packages. With this method, a semiconductor device is formed with a structure in which: a semiconductor chip is flip-chip bonded to the lower package (wiring board); terminals (pads) of the lower package are formed at a peripheral region around the chip on the lower package; terminals (pads) of an upper package (wiring board) are formed on the mounting surface side of the upper package at a region corresponding to the peripheral region; and the terminals of the lower and upper packages are bonded to each other via external terminals formed on both surfaces of an interposer having a thickness larger than the thickness of the chip (inclusive of the electrode terminals thereof).

In this bonding method, a process for fabricating an interposer is additionally required. The typical process for the fabrication includes the steps of: preparing a core member; forming through holes at required positions; filling the through holes with a conductor; forming resist layers on both surfaces; forming a wiring layer in a required pattern in connection with the conductor; removing the resist layer; forming an insulating layer (solder resist layer) through which external terminal formation portions of the wiring layer is exposed; and performing a required plating (nickel/gold plating or the like) on the external terminal formation portions.

In addition, as another method of implementing the above POP bonding, there is a method in which terminals (pads) of upper and lower packages are bonded to each other by use of solder. With this method, a semiconductor device is formed with a structure in which: a semiconductor chip is flip-chip bonded to the lower package (wiring board); and terminals (pads) formed at a peripheral region around the chip on the lower package are bonded via solder bumps to terminals (pads) formed on the mounting surface side of the upper package (wiring board) at a region corresponding to the peripheral region on the lower package.

An example of the techniques related to the above conventional art is described in Japanese unexamined Patent Publication (JPP) (Kokai) 2006-196860. This publication discloses a semiconductor package having: a board formed of a plurality of insulating resin layers; terminals for mounting a semiconductor element, which are formed on one of the surfaces of this board; and external connection terminals formed on the other surface of this board. In this package, each of the external connection terminals is formed as a bump protruding from the surface of the package. The inside of the bump is filled with insulating resin, and the surface of the bump is covered by metal. Moreover, each terminal for mounting a semiconductor element and corresponding pieces of metal are connected to each other through wiring including a conductive via.

As described above, in the conventional art, bonding by use of an interposer or solder is performed for implementing POP bonding. However, in the case where an interposer is used for bonding, a process (considerable manufacturing steps) for fabricating the interposer is additionally required, and a material for fabricating the interposer is required as well. Accordingly, there arises a problem in that manufacturing costs increase.

Meanwhile, in the case where solder is used for bonding, the gap between the upper and lower packages is large because of the presence of the chip mounted between the packages. Accordingly, a large amount of solder (bump) is used for bonding the packages together. In this case, there are inconveniences such as separation of the bump (separation of the solder) during reflow soldering, and formation of a bridge between adjacent bumps. This produces a problem in that the reliability of bonding between the upper and lower packages is lowered.

SUMMARY OF THE INVENTION

An object of the present invention is to provide a wiring board which allows POP bonding to be easily performed with low costs and enables to achieve an improvement in the reliability of the bonding, and a method of manufacturing the same.

According to one aspect of the invention, there is provided a wiring board having a structure in which multiple wiring layers are stacked one on top of another with insulating layers each interposed between corresponding two of the wiring layers, and the multiple wiring layers are connected to each other through vias formed in the insulating layers, respectively, the wiring board including: a first pad which is arranged in a peripheral region around an electronic component mounting area of an outermost insulating layer on one of both surfaces of the wiring board, which is connected to a corresponding one of the vias, and which is formed in a bump shape to cover a surface of a portion of the outermost insulating layer, the portion being formed to protrude; and a second pad which is arranged in the electronic component mounting area, which is connected to a corresponding one of the vias, and a surface of which is exposed from the insulating layer.

With the configuration of the wiring board (package) according to this aspect, the second pad is arranged in the electronic component mounting area on the outermost insulating layer, and the first pad arranged in a peripheral region thereof is formed by causing a portion of the insulating layer to protrude in a bump shape, the first pad covering a surface of the portion thereof. Thus, POP bonding can be easily performed. Specifically, when a different package is bonded to the first pad via a solder bump, the gap between the surface of the first pad and an electrode pad of the different package (i.e., the gap between the upper and lower packages) can be made relatively narrow. Thus, without placing an interposer such as used in the conventional art, the upper and lower packages can be easily bonded to each other via a small amount of solder in accordance with the narrowed gap. Consequently, the interposer is no longer needed in performing POP bonding, so that reduction in costs can be achieved.

Moreover, the gap between the upper and lower packages can be made smaller when POP bonding is performed, so that the amount of usage of solder for bonding the upper and lower packages can be made less as well. As a result, the inconveniences such as separation of solder and formation of a bridge, which are observed in the prior art, can be resolved. This advantage thus contributes to an improvement in the reliability of the bonding between the upper and lower packages.

According to another aspect of the invention, there is provided a method of manufacturing a wiring board, including: forming a first resist layer on a support base material, the first resist layer being patterned to have an opening portion in a manner to leave a portion corresponding to an electronic component mounting area, the opening portion corresponding to a shape of a first pad to be formed at a corresponding portion in a peripheral region around the electronic component mounting area; forming a support base member having a recessed portion by removing a required amount of a portion of the support base material, the portion being exposed through the opening portion of the first resist layer; forming, after removing the first resist layer, a second resist layer on a surface of the support base member where the recessed portion is formed, the second resist layer being patterned to have a first opening portion according to a shape of a second pad to be formed at the portion corresponding to the electronic component mounting area, and to have a second opening portion at a portion corresponding to the recessed portion; forming a plurality of metal layers respectively on portions of the support base member and on an inner wall surface of the recessed portion in the support base member, the portions and the recessed portion being exposed through the first and second opening portions of the second resist layer; forming, after removing the second resist layer, an insulating layer on a surface of the support base member where the metal layers are formed, in such a manner that a portion of each of the metal layers is exposed; forming a wiring layer on the insulating layer, the wiring layer including vias connected to the metal layers, respectively; and alternately stacking a required number of insulating layers and wiring layers and removing the support base member.

With reference to the following embodiments of the invention, descriptions are given below of other features in configuration of the wiring board and the method of manufacturing thereof according to the present invention, and characteristic advantages based on the features thereof, and so on.

BRIEF DESCRIPTION OF THE DRAWINGS

FIG. 6 is a cross-sectional view showing a configuration example (semiconductor device) in the case where a POP structure is implemented by using the package in FIG. 1;

DESCRIPTION OF THE PREFERRED EMBODIMENTS

Hereinafter, descriptions are given of preferred embodiments of the present invention with reference to the accompanying drawings.

(First Embodiment; See FIGS. 1 to 7)

Figure 1:
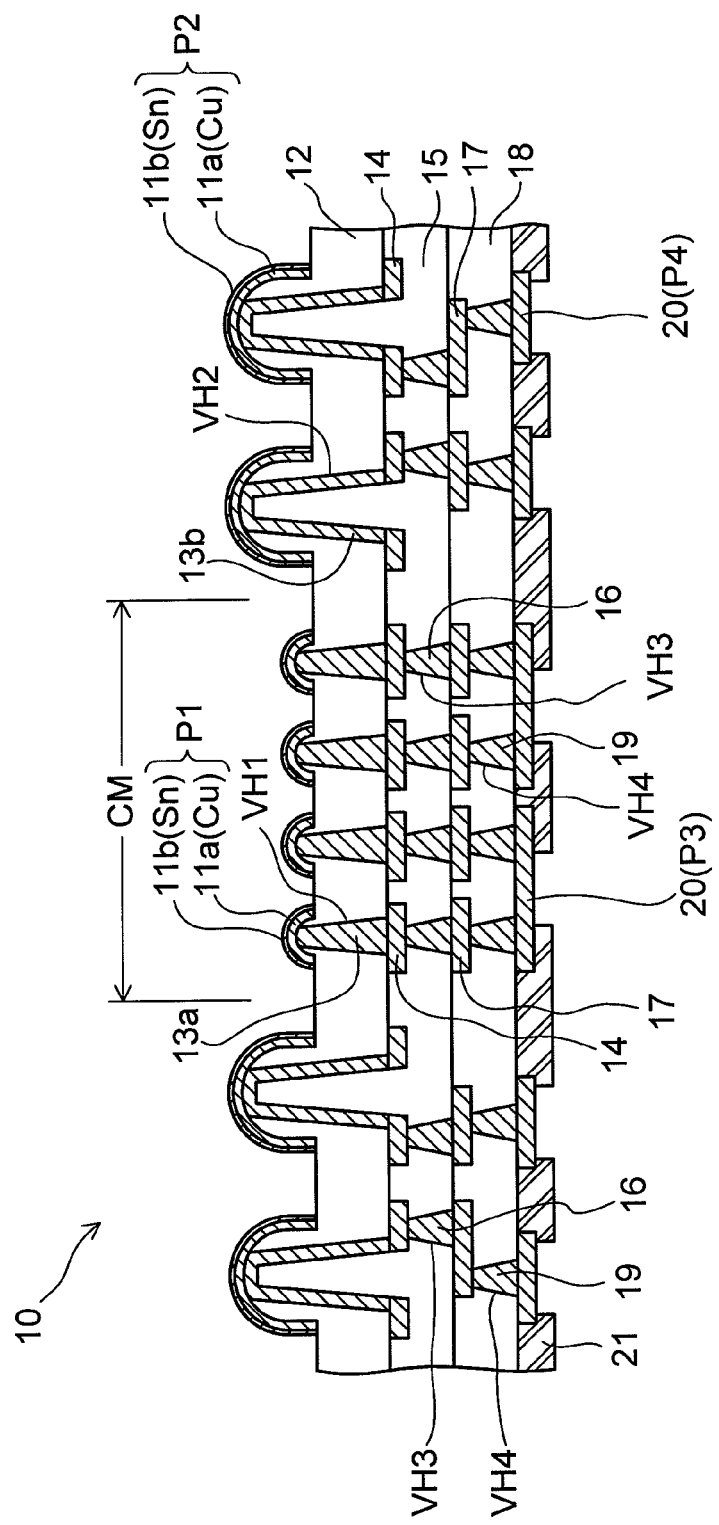
FIG. 1 is a cross-sectional view showing a configuration of a wiring board (semiconductor package) according to a first embodiment of the present invention.

FIG. 1 shows a configuration of a wiring board (semiconductor package) according to a first embodiment of the present invention, in the form of a cross-sectional view.

A wiring board (semiconductor package) 10 according to the present embodiment has a structure in which multiple wiring layers 14, 17 and 20 are stacked one on top of another with insulating layers (specifically, resin layers) 12, 15 and 18 interposed between corresponding wiring layers, as illustrated. In this structure, the wiring layers 14, 17 and 20 are connected via conductors (vias 13a and 13b, 16 and 19), respectively, filled into via holes VH1 and VH2, VH3 and VH4 each formed in a corresponding one of the insulating layers 12, 15 and 18. Specifically, the package 10 has the form of a "coreless substrate," which does not include a support base member, and is different from a wiring board fabricated by using a general build-up process (in which a required number of build up layers are sequentially formed and stacked on both surfaces or a single surface of a core substrate serving as a support base member).

Two kinds of pads P1 and P2 are exposed on the resin layer 12 positioned outermost on one (top side on the illustrated example) of surface sides of the coreless substrate. The pads P1, which are ones of the two kinds, are arranged in a chip mounting area CM on the resin layer 12, and the pads P2 of the other kind are arranged in a peripheral region around the chip mounting area CM. Each of the pads P1 and P2 is formed so as to protrude from the surface of the package 10 as illustrated. The portion of the resin where each of the pads P1 and P2 is arranged on the resin layer 12 is formed in a hemispherical shape. Each of the pads P1 and P2 is formed in an eggshell shape covering the surface of a corresponding one of the resin portions each formed in a hemispherical shape. In other words, each of the pads P1 and P2 has a hollow bump shape unlike a flat shape provided in a general semiconductor package. The pad having the bump shape of this kind is referred to as a "bump-shaped pad" for the sake of convenience in the description below.

In the present embodiment, electrode pads of an electronic component (chip) such as a semiconductor element to be mounted on the package 10 are flip-chip bonded to the pads P1, respectively, by use of a conductor material such as a solder bump, among the pads P1 and P2 exposed from the resin layer 12. Moreover, electrode pads of another package to be POP (package-on-package) bonded to the package 10 are bonded to the pads P2, respectively, by use of a conductor material such as a solder bump. For this reason, the heights of the pads P1 and P2 are appropriately selected so that the apex of the surface of each of the pads P1 arranged in the chip mounting area CM can be lower than the apex of the surface of each of the pads P2 by a predetermined height in accordance with the thickness (height) of the chip to be mounted, the pads P2 arranged around the chip mounting area CM.

In addition, each of the bump-shaped pads P1 and P2 has a structure in which two metal layers 11a and 11b are stacked as illustrated. In the present embodiment, the metal layer 11a on the inner side (side to be in contact with the resin layer 12) is formed of copper (Cu), and the metal layer 11b on the outer side (side to be exposed) is formed of tin (Sn).

Meanwhile, on a surface (a lower side surface in the illustrated example) on the opposite side to the side where the pads P1 and P2 are formed, a solder resist layer (insulating layer) 21 functioning as a protection film is formed so as to cover the surface of the outermost wiring layer (wiring layer 20 in the illustrated example) except for the portions of pads P3 and P4 each defined at a required position of the outermost wiring layer. Among the pads P3 and P4 exposed from the solder resist layer 21, the pads P3 are connected to the pads P1 in the chip mounting area CM through the vias 19, the wiring layer 17, the vias 16, the wiring layer 14 and the vias 13a. In addition, the pads P4 are connected to the pads P2 in the peripheral region around the chip mounting area CM through the vias 19, the wiring layer 17, the vias 16, the wiring layer 14 and the vias 13b.

External connection terminals such as solder balls for use in mounting of the package 10 on a motherboard or the like are bonded to the pads P3 and P4 exposed from the solder resist layer 21, respectively. Specifically, in the present embodiment, the surface side where the bump-shaped pads P1 and P2 are formed is used as a "chip mounting surface (package bonding surface), and the surface side where the solder resist layer 21 is formed is used as an "external connection terminal bonding surface."

However, depending on conditions where the package 10 is used, use conditions of the package 10, an arrangement form for POP bonding or the like, the package 10 can be used in a form in which the chip mounting surface (package bonding surface) and the external connection terminal bonding surface are set upside down as described later.

Note that, the solder resist layer 21 formed on one of the surfaces of the package 10 fulfills a function as a reinforcing layer in addition to the function as a protection film. Specifically, the package 10 is a coreless substrate having a low rigidity, and the thickness thereof is also thin, so that it is undeniable that the strength of the board decreases more than a little. However, the solder resist layer 21 is formed on one of the surfaces of the board as illustrated in order to reinforce the board.

The wiring board (semiconductor package) 10 according to the present embodiment is characterized in that each of the surfaces of the pads P2 for POP bonding, which are arranged around the chip mounting area CM on the outermost resin layer 12, is provided so as to protrude high in a bump shape from the surface of the package 10. This characteristic configuration is the same in packages according to the other embodiments to be described later.

Descriptions of a specific material, size, thickness and the like of each component forming the package 10 are provided in relation with processes to be described hereinafter.

Next, a description is given of a method of manufacturing the wiring board (semiconductor package) 10 according to the first embodiment with reference to FIGS. 2A to 5C showing an example of the manufacturing steps.

Figure 2A:
FIGS. 2A to 2E are cross-sectional views showing steps of a method of manufacturing the package shown in FIG. 1.
Figure 2B:
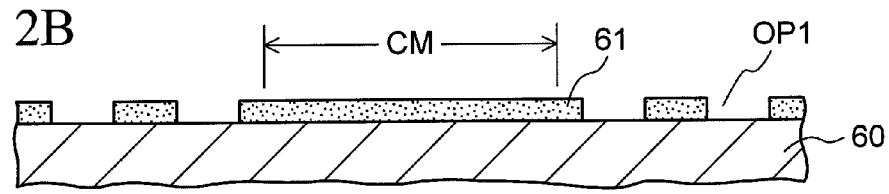

First, a support base member 60 is prepared as a temporary board in the initial step (See FIG. 2A). As a material for the support base member 60, a metal (typically, copper (Cu)) soluble in an etchant is used in considering that the material is eventually etched away as described later. Moreover, a metal plate or a metal foil is sufficient for use as a form of the support base member 60, basically. Specifically, a structure (for example, the support base member disclosed in JPP (Kokai) 2007-158174)) obtained by the following manner can be preferably used as the support base member 60. An underlying layer and a copper foil are disposed on a prepreg (e.g., a bonding sheet in a semi-cured B stage, formed by impregnating a thermosetting resin such as an epoxy-base resin or a polyimide-base resin into a glass fiber which is a reinforcement material), and then heat and pressure are applied to the prepreg to obtain the structure, for example.

In the next step (See FIG. 2B), an etching resist is formed on the support base member 60 by using a patterning material, and a resist layer 61 is formed in a required shape by patterning. The resist layer 61 is patterned to have a portion corresponding to the chip mounting area CM (in size slightly larger than the chip mounting area CM) defined on the resin layer 12 positioned outermost on the chip mounting surface (package bonding surface) side, and also to have opening portions OP1 according to the shape of required pads P2 to be formed at corresponding portions around the chip mounting area CM.

A photosensitive dry film (a structure in which a resist material is held between a polyester cover sheet and a polyethylene separator sheet) or a liquid photoresist (liquid resist such as a novolak-base resin or an epoxy-base resin) can be used as the patterning material. For example, in a case where the dry film is used, the surface of the support base member 60 is cleaned, and thereafter, the dry film is attached thereonto by thermal compression bonding. The dry film is then cured by subjecting the dry film to exposure under ultraviolet (UV) irradiation by use of a mask (not illustrated) patterned in a required shape. Thereafter, the corresponding portion is etched away by use of a predetermined developing solution. The resist layer 61 according to the required pattern is thus formed. The resist layer 61 can be formed through the same steps in a case where the liquid photoresist is used as well.

In the next step (See FIG. 2C), with respect to the support base member 60 including the resist layer (etching resist) 61 formed thereon, half etching is performed using the etching resist 61 as the mask so that the portions of the support base member 60 exposed from the opening portions OP1 is half etched to have a required depth. For example, the portions of the support base member (Cu) 60 are selectively etched away by a required amount with respect to the resist layer 61 by wet etching using a ferric chloride aqueous solution, a copper chloride aqueous solution, an ammonium persulfate aqueous solution or the like. Thereby, each of the portions of the support base member 60*a* is removed in a hemispherical shape in accordance with the etching amount, and recessed portions DP1 are thus formed as illustrated.

The recessed portions DP1 (i.e., the etching amount) of the support base member 60*a* define, together with an etching amount by the second half etching to be performed for the same portions in a later step, the height of the bump-shaped pads P2 to be formed, so that etching conditions, time and the like need to be appropriately selected while appropriately considering the thickness of a chip to be mounted, the height of the bump-shaped pads P1 for mounting the chip, and the like.

In the next step (See FIG. 2D), the resist layer 61 used as the etching resist is removed. For example, in a case where a dry film is used as the etching resist, an alkaline chemical liquid such as sodium hydroxide or a monoethanolamine-base liquid can be used for removal. Further, in a case where a liquid resist such as a novolak-base resin or an epoxy-base resin is used as the etching resist, acetone, alcohol or the like can be used for removal. In this manner, the support base member 60*a* having the recessed portions DP1 at the required positions, respectively, as illustrated is formed.

In the next step (See FIG. 2E), a plating resist is formed by using a patterning material on the surface of the support base member 60*a* where the recessed portions DP1 are formed, and a resist layer 62 is formed by patterning the plating resist in a required shape. The resist layer 62 is patterned to have opening portions OP2 according to the shape of the required pads P1 to be formed at corresponding portions in the chip mounting area CM and the opening portions OP1 according to the shape of the required pads P2 to be formed at corresponding portions around the chip mounting area CM. A photosensitive dry film or a liquid photo resist can be used in the same manner as the patterning material used in the step in FIG. 2B.

Figure 2C:
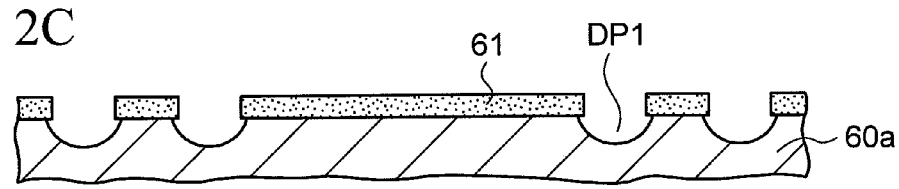

In the next step (See FIG. 3A), in the same manner as the process performed in the step in FIG. 2C, with respect to the support base member 60*a* including the resist layer 62 formed thereon (FIG. 2E), half etching is performed using the etching resist 62 as the mask so that the portions of the support base member 60*a* exposed from the opening portions OP1 and OP2 are half etched to have required depths, respectively. Thereby, each of the portions in the chip mounting area CM of the support base member 60*b* is removed in a hemispherical shape in accordance with the etching amount, and recessed portions DP3 are thus formed as illustrated. In addition, each of the portions around the chip mounting area CM is removed to have a larger depth by the second half etching, and recessed portions DP2 are thus formed.

In the next step (See FIG. 3B), a metal layer 63 having a two-layer structure is formed by electrolytic plating using the support base member 60*b* as a power feeding layer on the inner wall surface of each of the recessed portions DP2 and DP3 of the support base member 60*b*, which are exposed through the opening portions OP1 and OP2 (FIG. 2E) of the resist layer 62, respectively. In this case, as the material forming the lower side metal layer (metal layer on the side to be exposed, eventually), a metal species insoluble in an etchant is selected in considering that the support base member 60*b* in contact therewith is eventually etched away. In the present embodiment, since copper (Cu) is used as the material for the support base member 60*b*, nickel (Ni) is used as a metal different from copper.

Specifically, the metal layer 63 is obtained by forming an Ni layer 11*c* with a thickness of approximately 5 μm on the support base member (Cu) 60*b* by nickel (Ni) plating first, and then forming a Cu layer 11*a* with a thickness of approximately 15 μm on the Ni layer 11*c* by copper (Cu) plating. The Ni layer 11*c*, which is the lower side layer of the metal layer 63, functions as a sacrifice conductive layer and is eventually subjected to etching. In addition, the Cu layer 11*a*, which is the upper layer of the metal layer 63, remains eventually, and forms a portion of each of the bump-shaped pads P1 and P2 (See FIG. 1).

Figure 2D:

In the next step (See FIG. 3C), the resist layer 62 used as the plating resist is removed. As to the removal method, the method described in the step in FIG. 2D is used. In this manner, a structure in which the metal layer 63 (Ni layer 11*c*/Cu layer 11*a*) having the two-layer structure is formed is fabricated on the inner wall surface of each of the recessed portions DP2 and DP3 of the support base member 60*b* as illustrated.

In the next step (See FIG. 3D), the insulating layer 12 formed of an epoxy-base resin, a polyimide-base resin or the like is formed on the surface of the support base member 60*b* where the metal layer 63 is formed. For example, an epoxy-base resin film is laminated on the support base member 60*b* and the metal layer 63, and then, the resin film is cured by heat processing at a temperature of 130 to 150° C. while the resin film is pressed. The resin layer (insulating layer 12) can be formed in this manner.

In this case, since the thickness of the resin film is relatively thin as compared with the depth of the recessed portions DP2 of the support base member 60*b*, it is difficult to secure flatness of the surface of the insulating layer 12 (surface side where a wiring is formed) by one laminating operation. Thus, it is preferable to perform two or more laminating operations separately. In other words, in a case where the wiring formation surface of the insulating resin becomes irregular when the insulating resin (resin film, for example) is provided on the support base member 60*b* including the deep recessed portions DP2 formed thereon, the wiring formation surface of the insulating resin can be made flat by forming the insulating layer in multiple separate steps. Thereby, the accuracy of the wiring formation improves.

In the next step (See FIG. 4A), opening portions (via holes VH1 and VH2) each extending to the metal layer 63 are formed at predetermined portions (corresponding portions of the metal layer 63 formed on the inner wall surfaces of the recessed portions DP2 and DP3, respectively, of the support base member 60*b*), respectively, of the insulating layer 12 by a hole making process with a $CO_2$ laser, an excimer laser or the like. Note that, although a laser or the like is used to form the via holes VH1 and VH2 in this step, photolithography can be also used to form the required via holes when the insulating layer 12 is formed of a photosensitive resin.

In the next step (See FIG. 4B), on the insulating layer 12 including the via holes VH1 and VH2 formed thereon, the wiring layer 14 having a required pattern and connected to the metal layers 63 is formed by filling in the via holes VH1 in the chip mounting area CM (formation of vias 13*a*) and by coating the inner wall surfaces of the via holes VH2 around the chip mounting area CM with the wiring layer 14 (formation of vias 13*b*). A semi-additive process is used for the formation of the wiring layer 14, for example.

Specifically, a copper (Cu) seed layer (not illustrated) is formed on the insulating layer 12 and also in the via holes VH1 and VH2 by electroless plating, sputtering or the like, first. Then, a resist film (not illustrated) is formed, the resist film including opening portions according to the shape of the wiring layer 14 to be formed. Next, a conductor (Cu) pattern (not illustrated) is formed on the seed layer (Cu) by electrolytic Cu plating using the seed layer as a power feeding layer, the seed (Cu) layer exposed through the opening portions of the resist film. Furthermore, the seed layer is etched by using the conductor (Cu) pattern as the mask after the resist film is removed. Thereby, the required wiring layer 14 is obtained.

Note that, other than the semi-additive process, various wiring forming methods including a subtractive process and the like can be used. In addition, the method of forming the vias 13a and 13b is not limited to electroless plating or the like, but a screen printing method can be used to form the vias 13a and 13b by filling the holes with conductive paste (silver paste, copper paste or the like). However, in a case where the conductive paste is used, the vias 13b around the chip mounting area CM are formed by filling the via holes with the conductor as in the case of the vias 13a in the chip mounting area CM.

In the next step (See FIG. 4C), the insulating layers and the wiring layers are alternately stacked in the same manner as the processes performed in the steps in FIGS. 3D to 4B. In the illustrated example, two insulating layers and two wiring layers are stacked for the simplicity of description. Specifically, a resin layer (insulating layer 15) is formed on the surface of the insulating layer 12 which is opposite to the level outermost surface on which the pads P1 and P2 are formed., and the wiring layer 14. As shown in, ex., FIG. 4C, the insulating layer 15 penetrates inside the wiring 14 in the via hole VH2 of vias 13b, i.e., the insulating layer 15 is filled in the via holes VH2. Then, the via holes VH3, which extend to the pads (not illustrated) of the wiring layer 14, respectively, are formed on the insulating layer 15. Thereafter, the wiring layer 17 having a required pattern and connected to the pads is formed by filling in these via holes VH3 (formation of the vias 16). Moreover, a resin layer (insulating layer 18) is formed on the insulating layer 15 and the wiring layer 17. Then, the via holes VH4, which extend to the pads (not illustrated) of the wiring layer 17, respectively, are formed on the insulating layer 18. Thereafter, the wiring layer 20 having a required pattern and connected to the pads is formed by filling in these via holes VH4 (formation of the vias 19). The wiring layer 20 forms the outermost wiring layer in the present embodiment.

Moreover, the solder resist layer 21 is formed so as to cover the surface (insulating layer 18 and wiring layer 20) excluding the pads 3P and 4P each defined at a predetermined position of the wiring layer 20. The solder resist layer 21 can be formed, for example, by laminating a photosensitive solder resist film or applying a liquid photoresist onto the surface, and then patterning the resist in a required shape. In this manner, the pads 3P and 4P are exposed through the opening portions of the solder resist layer 21.

To these pads P3 and P4, external connection terminals such as solder balls or pins used in mounting of the package 10 on a motherboard or the like are bonded. Thus, Au plating is preferably performed on the pads P3 and P4 in order to improve contact characteristics. At this time, Ni plating is performed first on the pads (Cu) P3 and P4, and thereafter, Au plating is performed thereon. Specifically, a conductive layer (not illustrated) having a two-layer structure including the Ni layer and the Au layer is formed on each of the pads P3 and P4.

In the next step (See FIG. 5A), the support base member 60b (FIG. 4C) used as the temporary board is selectively removed with respect to the metal layers 63 having the two-layer structure (Ni layer 11c/Cu layer 11a), the resin layer 12, the pads P3 and P4 and the solder resist layer 21. For example, the support base member 60b can be selectively etched away with respect to the metal layers 63 (Ni layer 11c is formed on the outer side thereof), the resin layer 12, the pads P3 and P4 (Au layer is formed on the surface layer portion of each of the pads) and the solder resist layer 21 by wet etching using a ferric chloride aqueous solution, a copper chloride aqueous solution, an ammonium persulfate aqueous solution or the like. Thereby, the wiring board including the metal layers 63 each exposed in a bump shape as illustrated is formed.

In the next step (See FIG. 5B), the Ni layer 11c (metal layer on the side where the metal layer 63 is exposed) used as the sacrifice conductive layer is selectively removed with respect to the resin layer 12, the pads P3 and P4 and the solder resist layer 21. In this manner, the wiring board including the Cu layers 11a each exposed in a bump shape as illustrated is formed.

In the final step (See FIG. 5C), a tin (Sn) layer 11b with a thickness of approximately 5 μm is formed by electroless plating, for example, on the Cu layers 11a each exposed in a bump shape from the region in the chip mounting area CM and from the peripheral region around the chip mounting area CM of the wiring board. In this manner, the bump-shaped pads P1 and P2 each formed of the two-layer structure (Cu layer 11a/Sn layer 11b) are exposed from the corresponding regions as illustrated.

Through the aforementioned steps, the wiring board 10 (FIG. 1) of the present embodiment is fabricated.

In the wiring board (semiconductor package) 10 of the present embodiment, electrode pads of a chip are bonded, via solder bumps or the like, to the pads P1 exposed from one of the surfaces as described above, and electrode pads of another package are bonded to the pads P2 via solder bumps or the like. Further, external connection terminals such as solder balls are bonded to the pads P3 and P4 exposed from the other one of the surfaces. FIG. 6 is a diagram showing a configuration example of the wiring board 10.

The example in FIG. 6 shows a cross-sectional structure of a state in which a semiconductor element (active device chip such as a CPU, to be specific) 31 as the electronic component is mounted on the wiring board 10, and a different package 40 is further mounted. Specifically, the example shows the cross-sectional structure in a case where a semiconductor device 30 having a POP structure is formed. The electrode pads (not shown) of the chip 31 to be mounted are flip-chip bonded to the pads P1 in the chip mounting area CM via solder bumps 32. At the time of bonding, the surfaces of the pads P1 are formed so as to be at a position lower than that of the surfaces of the bump-shaped pads P2 by a predetermined height in accordance with a thickness of the chip 31 to be mounted, the pads P2 arranged around the pads P1. Accordingly, the surface of the chip 31 only slightly protrudes from the position of the surfaces of the pads P2.

Moreover, underfill resin 33 (thermosetting epoxy-base resin or the like) is filled into the gap between the mounted chip 31 and the wiring board 10 (surface of the resin layer 12 facing the chip 31) and then is thermally cured. Thereby, the reliability of bonding between the chip 31 and the wiring board 10 is enhanced.

Moreover, to the pads P2 protruding from the resin layer 12 around the chip mounting area CM, electrode pads (not shown) formed on the mounting surface side of the different package 40 are bonded via solder bumps 34 (POP bonding), respectively. At the time of this bonding, since the surface of the chip 31 only slightly protrudes of the position of the surfaces of the pads P2 as described above, the gap between the surfaces of the pads P2 and the electrode pads of the upper package 40 (i.e., the gap between the upper package 40 and the lower package 10) is made relatively narrow, and the size of each of the bumps 34 can be thus reduced by the narrowed amount. Specifically, the amount of solder to be used can be made less, so that the inconveniences (separation of solder, formation of a bridge, and the like) observed in the prior arts can be resolved. This advantage thus contributes to an improvement in the reliability of the bonding.

Moreover, a semiconductor element (chip) 41 is mounted on a surface (top side in the illustrated example) opposite to the mounting surface side of the different package 40 as in the case of the package 10. Electrode pads (not shown) of the chip 41 are flip-chip bonded to pads (not shown) on the package 40 via solder bumps 42. Further, underfill resin 43 is filled into a gap between the mounted chip 41 and the package 40 and then is thermally cured. Thereby, the chip 41 is fixed onto the package 40.

Meanwhile, solder balls 35 are respectively bonded by reflow soldering to the pads P3 and P4 on the external connection terminal bonding surface opposite to the chip mounting surface (package bonding surface) of the package 10. In the illustrated example, the form of a BGA (ball grid array) in which the solder balls 35 are bonded to the pads P3 and P4, respectively, are employed. However, instead of this form, it is also possible to employ the form of a PGA (pin grid array) in which pins are bonded to the pads, respectively, or the form of an LGA (land grid array) in which the pads themselves are made to be external connection terminals.

Figure 7:
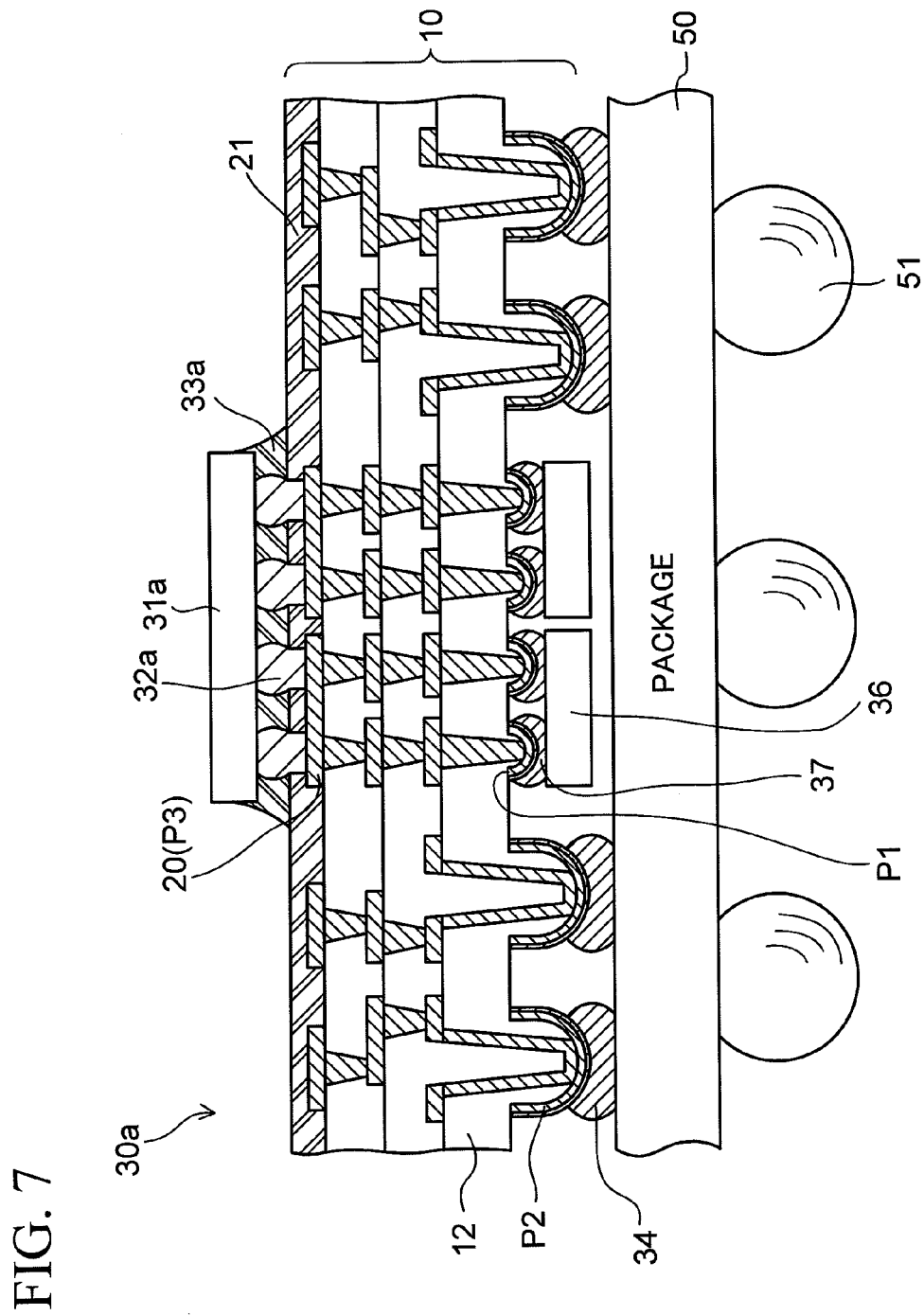
FIG. 7 is a cross-sectional view showing another configuration example (semiconductor device) in the case where a POP structure is implemented by using the package in FIG. 1.

In addition, as an arrangement form reverse to that in FIG. 6, the POP structure can be implemented while the chip mounting surface (package bonding surface) and the external connection terminal bonding surface are set upside down and then used. FIG. 7 shows a configuration example of this case.

The example in FIG. 7 shows a configuration (cross-sectional structure) of a semiconductor device 30a having a POP structure formed by reversing the upper and lower side relationship of the package from that shown in FIG. 6 and then mounting the package 10 on a different package 50. In the configuration example in FIG. 7, instead of the aforementioned active device (chip 31), chip capacitors 36 as passive devices are mounted on the chip mounting surface (package bonding surface) side. A pair of the electrode terminals of each of the chip capacitors 36 is bonded to the pads P1 by using solder pieces 37, respectively. In this configuration as well, the pads P1 are formed, so that the surfaces thereof are located at a position lower than that of the surfaces of the bump-shaped pads P2 by a predetermined height in accordance with the thickness of the chip capacitors 36 to be mounted, the pads P2 arranged around the pads P1. Thus, the surfaces of the chip capacitors 36 only slightly protrude of the position of the surfaces of the pads P2.

In addition, to the pads P2 arranged on the resin layer 12 around the chip mounting area CM (FIG. 1), electrode pads (not shown) formed on a side (top side in the illustrated example) opposite to the mounting surface side of a different package 50 are bonded via solder bumps 34 (POP bonding), respectively. At the time of this bonding, since the surfaces of the chip capacitors 36 only slightly protrude of the position of the surfaces of the pads P2 as described above, the gap between the surfaces of the pads P2 and the electrode pads of the lower package 50 (i.e., the gap between the upper package 10 and the lower package 50) is made relatively narrow, and thus, the size of each of the solder bumps 34 can be made small (specifically, the amount of solder to be used can be made less) by the narrowed amount. Thus, the inconveniences such as separation of solder, formation of a bridge, and the like, which are observed in the prior arts, can be resolved, and the reliability of POP bonding is enhanced.

In addition, electrode pads (not shown) are provided on the mounting surface side of the different package 50. Solder balls 51 as external connection terminals for use in mounting of the package 50 on a motherboard or the like are bonded to the electrode pads by reflow soldering.

Meanwhile, an active device (chip 31a) similar to the chip 31 in the configuration in FIG. 5 is mounted on the external connection terminal bonding surface opposite to the chip mounting surface (package bonding surface) of the wiring board 10. The electrode pads (not shown) of the chip 31a are flip-chip bonded to the pads P3 on the package 10 via solder bumps 32a, respectively. Further, underfill resin 33a is filled into a gap between the chip 31a and the package 10 and then is thermally cured. The chip 31a is thereby fixed onto the package 10. Note that, the illustration of the pads P4 (FIG. 6) on the external connection terminal bonding surface side of the package 10 is omitted in the example in FIG. 7.

As described above, with the wiring board (semiconductor package) 10 according to the present embodiment and the method of manufacturing the same (FIGS. 1 to 5C), the pads P1 for mounting a chip are arranged in the chip mounting area CM on the resin layer 12 positioned outermost on the chip mounting surface (package bonding surface) side. Moreover, each of the pads P2 for POP bonding is provided at the region around the chip mounting area CM in a way to protrude high in a bump shape from the surface of the package 10 (i.e., at least in a way that the surfaces of the pads P2 are located at a position higher than the position of the surfaces of the pads P1 by a predetermined height). Thus, as shown in the configuration examples shown in FIGS. 6 and 7, respectively, POP bonding can be easily performed.

Specifically, when the different package 40 (50) is POP bonded to the pads P2 via the solder bumps 34, the surface of the chip 31 (36) mounted on the package 10 only slightly protrudes of the position of the surfaces of the pads P2. Thus, the gap between the surfaces of the pads P2 and the electrode pads of the different package 40 (50), specifically, the gap between the upper package 40 and the lower package 10 (between the upper package 50 and the lower package 10) can be made relatively narrow. For this reason, without placing an interposer used in the prior art, bonding between the upper and lower packages can be easily performed via the solder bumps 34 of a smaller amount in accordance with the narrowed gap. Consequently, since the interposer is no longer needed in performing POP bonding, reduction in costs can be achieved.

In addition, the gap between the upper and lower packages can be made smaller when performing POP bonding, so that the amount of usage of solder (bumps) for bonding the packages becomes less. As a result, the inconveniences observed in the prior art such as separation of solder and formation of a bridge are resolved, and the reliability of bonding between the upper and lower packages improves.

In addition, each of the pads P1 and P2 has a structure in which the Sn layer 11b is exposed, so that each of the pads P1 and P2 has a good adhesiveness with solder (containing Sn as the primary component) used as the bonding material in chip mounting or POP bonding. Thus, the sufficient adhesion strength can be secured even when the amount of solder to be used is small.

Furthermore, each of the bump-shaped pads P1 and P2 includes resin (a portion of the resin layer 12) filled inside thereof. Thus, this form of each of the pads P1 and P2 is equivalent to a kind of a resin core ball, so that each of the pads P1 and P2 can serve a role as a cushion at the time of POP bonding.

In the aforementioned first embodiment, the description is given of the example of the case where not only each of the pads P2 for POP bonding but each of the pads P1 for mounting a chip also is formed so as to protrude in a bump shape from the surface of the package 10. However, as it is obvious from the gist of the present invention (forming the pads P2 for POP bonding arranged on the outermost resin layer 12 in a way that each of the surfaces of the pads P2 protrudes high in a bump shape from the surface of the package 10), each of the pads P1 for mounting a chip is not necessarily formed in a way to protrude from the surface of the package. Second and third embodiments to be described hereinafter show configuration examples of this case, respectively.

(Second Embodiment; See FIGS. 8 and 9)

Figure 8:
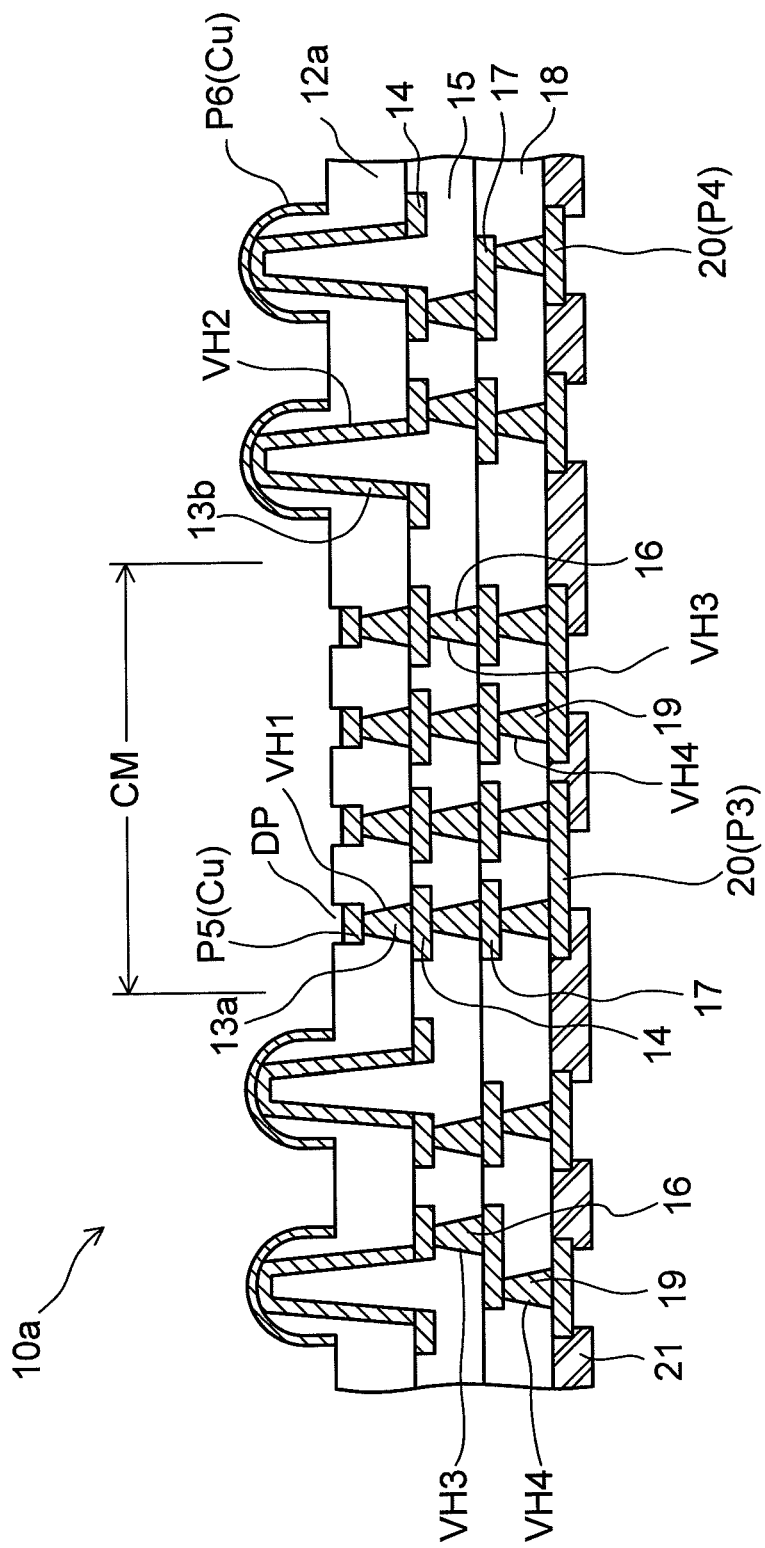
FIG. 8 is a cross-sectional view showing a configuration of a wiring board (semiconductor package) according to a second embodiment of the present invention.

FIG. 8 shows a configuration of a wiring board (semiconductor package) according to a second embodiment of the present invention, in the form of a cross-sectional view.

As compared with the configuration of the wiring board 10 (FIG. 1) according to the first embodiment, a wiring board (semiconductor package) 10a according to the second embodiment is different in the following points. First, the surfaces of pads P5 arranged in the chip mounting area CM are formed at a position recessed from the surface of a resin layer 12a to an inner side of the board by a predetermined depth. Thereby, the recessed portions DP are formed at positions corresponding to the pads P5 on the rein layer 12a, respectively. Second, the pads P5 for mounting a chip and pads P6 for POP bonding arranged in the peripheral region around the pads P5 are both formed of a single metal layer (Cu layer). Since the other configuration of the wiring board 10a is basically the same as the configuration of the wiring board 10 in FIG. 1, the description thereof is omitted herein.

Figure 9A:
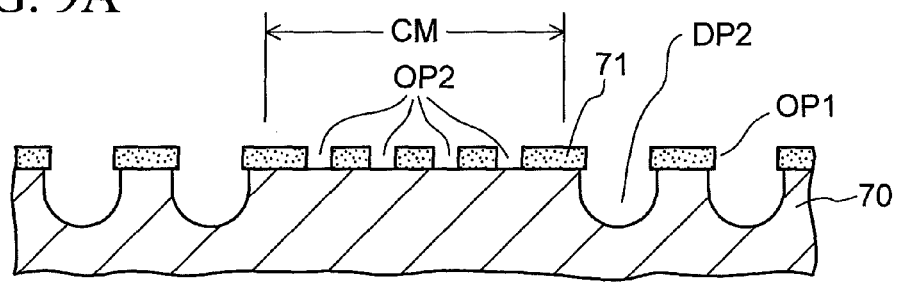
FIGS. 9A to 9C are cross-sectional views showing steps of a method of manufacturing the package shown in FIG. 8.
Figure 9B:
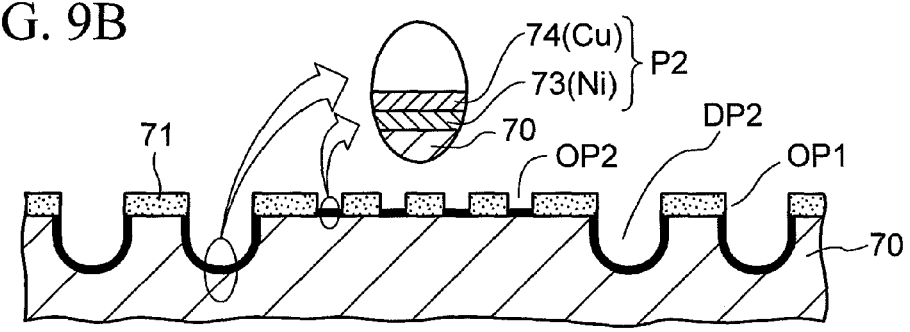
Figure 9C:
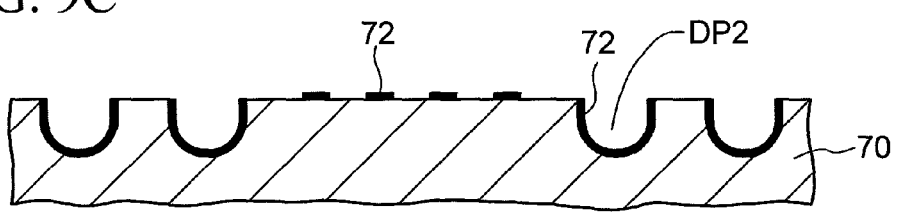

The wiring board 10a according to the present embodiment can be basically fabricated in the same manner as the processes performed in the steps (FIGS. 2A to 5C) of the aforementioned manufacturing method according to the first embodiment. However, processing steps for forming the recessed portions DP on the resin layer 12a in the chip mounting area CM are needed, so that processes to be performed in the steps related to the processing steps is slightly different. FIGS. 9A to 9C show the related processing steps.

Hereinafter, a method of manufacturing the wiring board (semiconductor package) 10a according to the second embodiment is described with reference to FIGS. 9A to 9C and FIGS. 2A to 5C.

First, in the same manner as the processes performed in the steps in FIGS. 2A to 2D, a support base member 70 having the recessed portions DP2 at required positions is prepared. However, in the present embodiment, when half etching is performed in the step in FIG. 2C, each of the recessed portions DP2 is formed to have a "larger depth," as formed in the step in FIG. 3A, by extending the etching time.

Figure 2E:
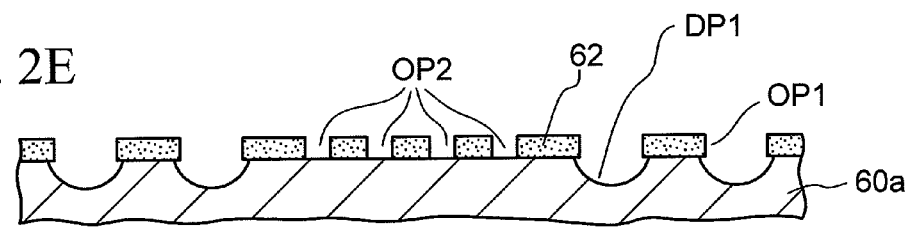

In the next step (See FIG. 9A), in the same manner as the process performed in the step in FIG. 2E, a plating resist is formed by using a patterning material on the surface of the support base member 70 where the recessed portions DP2 are formed, and then a resist layer 71 is formed by patterning the plating resist in a required shape. Specifically, the resist layer 71 is patterned to have the opening portions OP2 according to the shape of the required pads P5 to be formed at corresponding portions in the chip mounting area CM, and the opening portions OP1 according to the shape of the required pads P6 to be formed at corresponding portions around the chip mounting area CM.

Figure 3A:
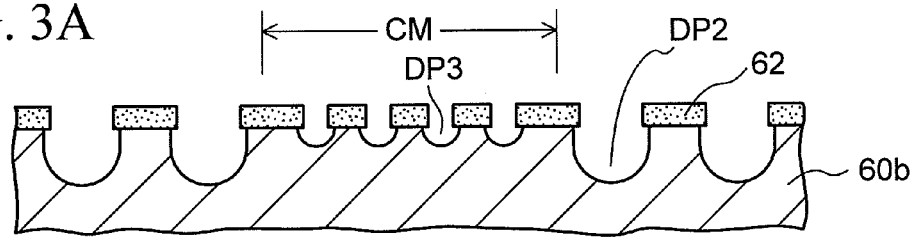
FIGS. 3A to 3D are cross-sectional views showing manufacturing steps subsequent to the steps in FIGS. 2A to 2E.
Figure 3B:
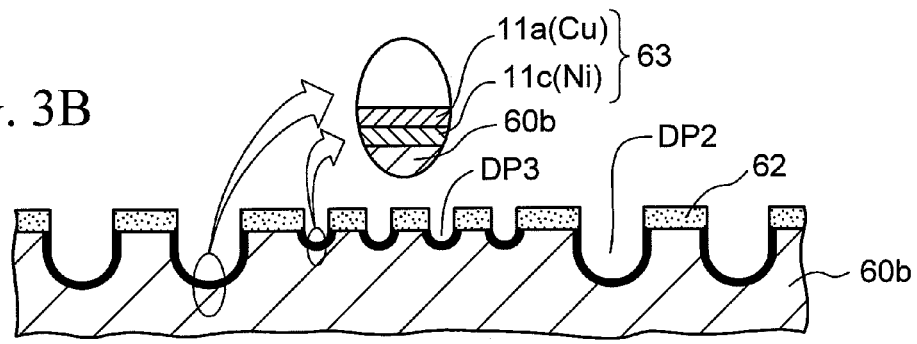

In the next step (See FIG. 9B), in the same manner as the process performed in the step in FIG. 3B, a metal layer 72 having a two-layer structure is formed by electrolytic plating using the support base member 70 as a power feeding layer on the support base member 70 exposed through the opening portions OP2 and OP1 of the resist layer 71 and the inner wall surface of each of the recessed portions DP2. Specifically, the metal layer 72 is obtained by forming a Ni layer 73 with a required thickness (thickness equivalent to the depth of the recessed portion DP to be formed) on the support base member (Cu) 70 by Ni plating, and then forming a Cu layer 74 with a thickness of approximately 15 μm on the Ni layer 73 by Cu plating. The Ni layer 73, which is the lower layer side of the metal layer 72, functions as a sacrifice conductive layer as in the aforementioned case, and is eventually subjected to etching. Further, the Cu layer 74, which is the upper layer side of the metal layer 72, remains eventually and forms the pads P5 and P6 (FIG. 8).

Figure 3C:
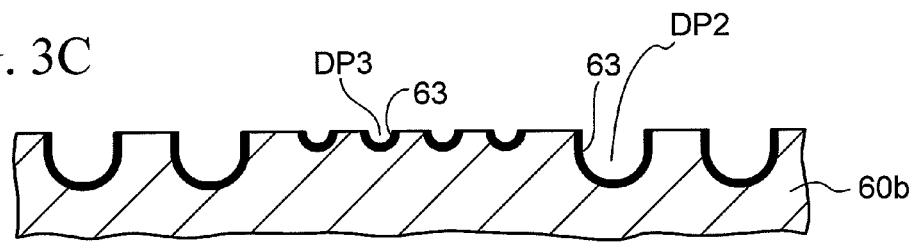
Figure 3D:
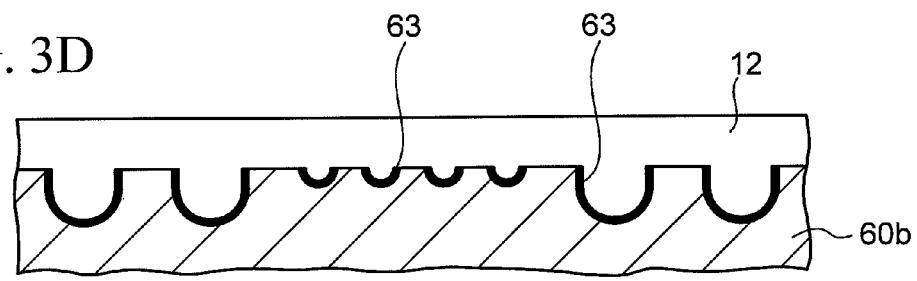
Figure 4A:
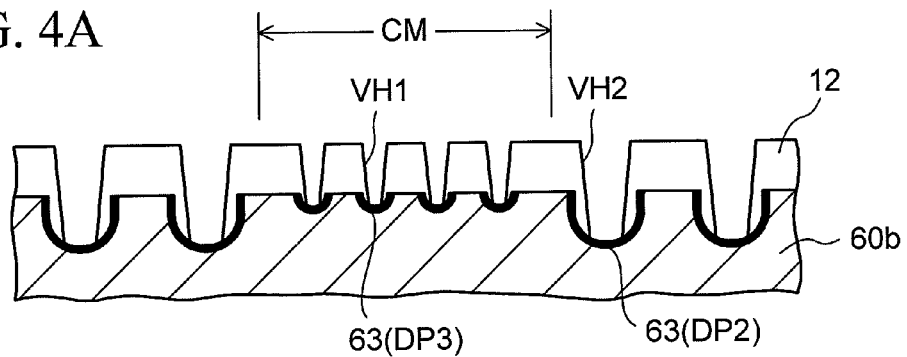
FIGS. 4A to 4C are cross-sectional views showing manufacturing steps subsequent to the steps in FIGS. 3A to 3D.
Figure 4B:
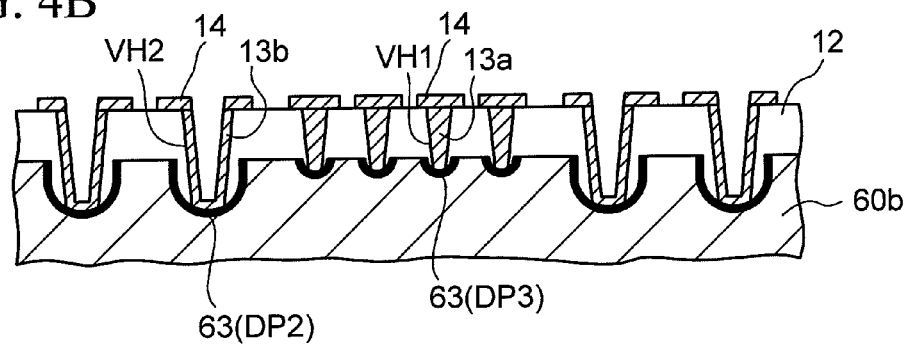
Figure 4C:
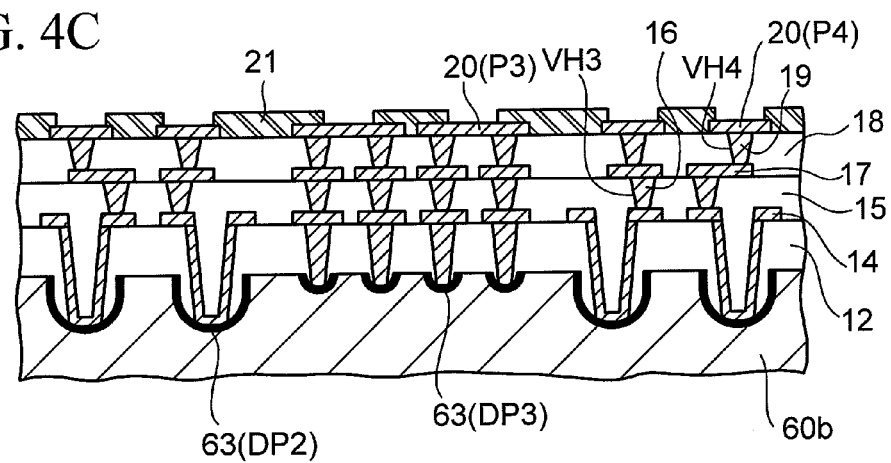
Figure 5A:
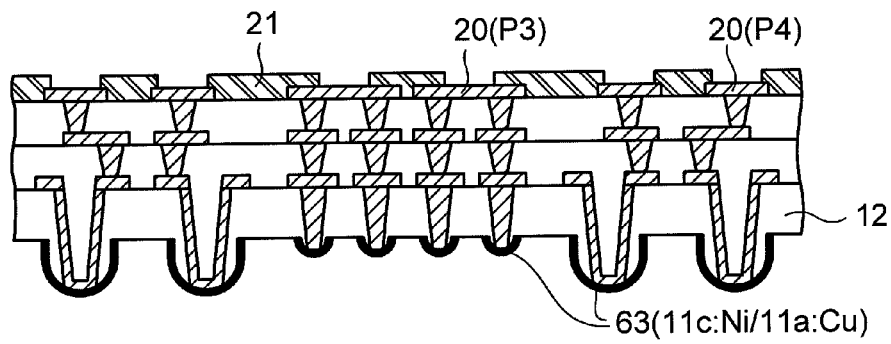
FIGS. 5A to 5C are cross-sectional views showing manufacturing steps subsequent to the steps in FIGS. 4A to 4C.
Figure 5B:
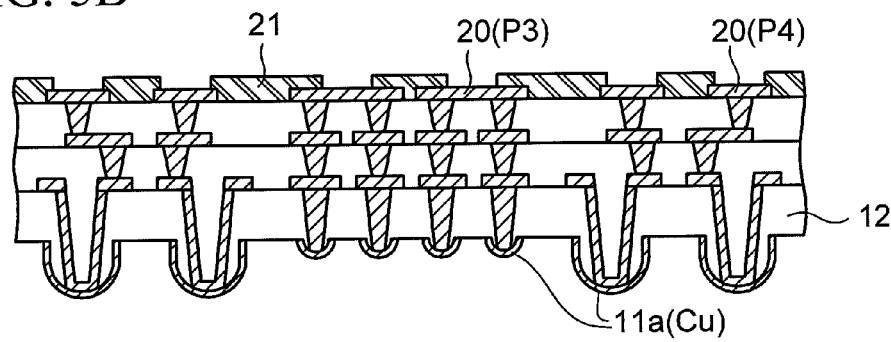
Figure 5C:
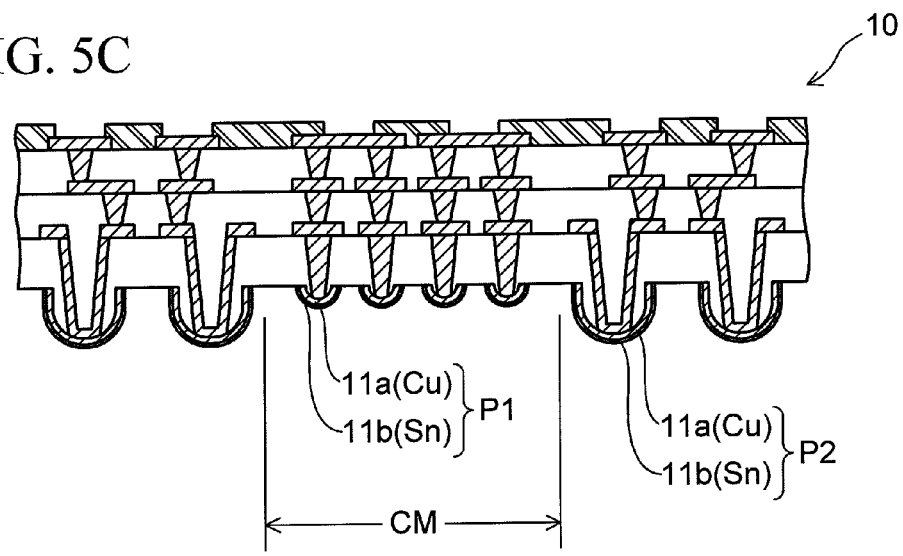

In the next step (See FIG. 9C), in the same manner as the process performed in the step in FIG. 3C, the plating resist (resist layer 71) is removed. Thereby, a structure in which the metal layer 72 having the two-layer structure (Ni layer 73/Cu layer 74) is formed on the support base member 70 and the inner wall surface of each of the recessed portions DP2 is fabricated.

Thereafter, through the same process performed in each of the steps in FIGS. 3D to 5B, the wiring board 10a (FIG. 8) of the present embodiment is obtained.

According to the second embodiment (FIGS. 8 and 9A to 9C), the following advantages can be further obtained in addition to the effects obtained in the aforementioned first embodiment (FIGS. 1 to 7). Specifically, since the recessed portions DP are formed at the positions corresponding to the pads P5 on the resin layer 12a in the chip mounting area CM, pre-soldering (solder attachment) can be easily performed in the recessed portions DP, and when an electronic component (chip) is bonded to the package 10a prior to POP bonding (FIGS. 6 and 7), position adjustment of the electrode terminals of the chip and the attached solder can be easily performed.

In addition, since the pads P5 and P6 are both formed of a single metal layer (Cu layer), the process to form the Sn layer 11b is no longer necessary in the last step (FIG. 5C) of the processing unlike in the case of the aforementioned first embodiment. This advantage contributes to simplification of the manufacturing steps.

(Third Embodiment; FIGS. 10 to 12c)

Figure 10:
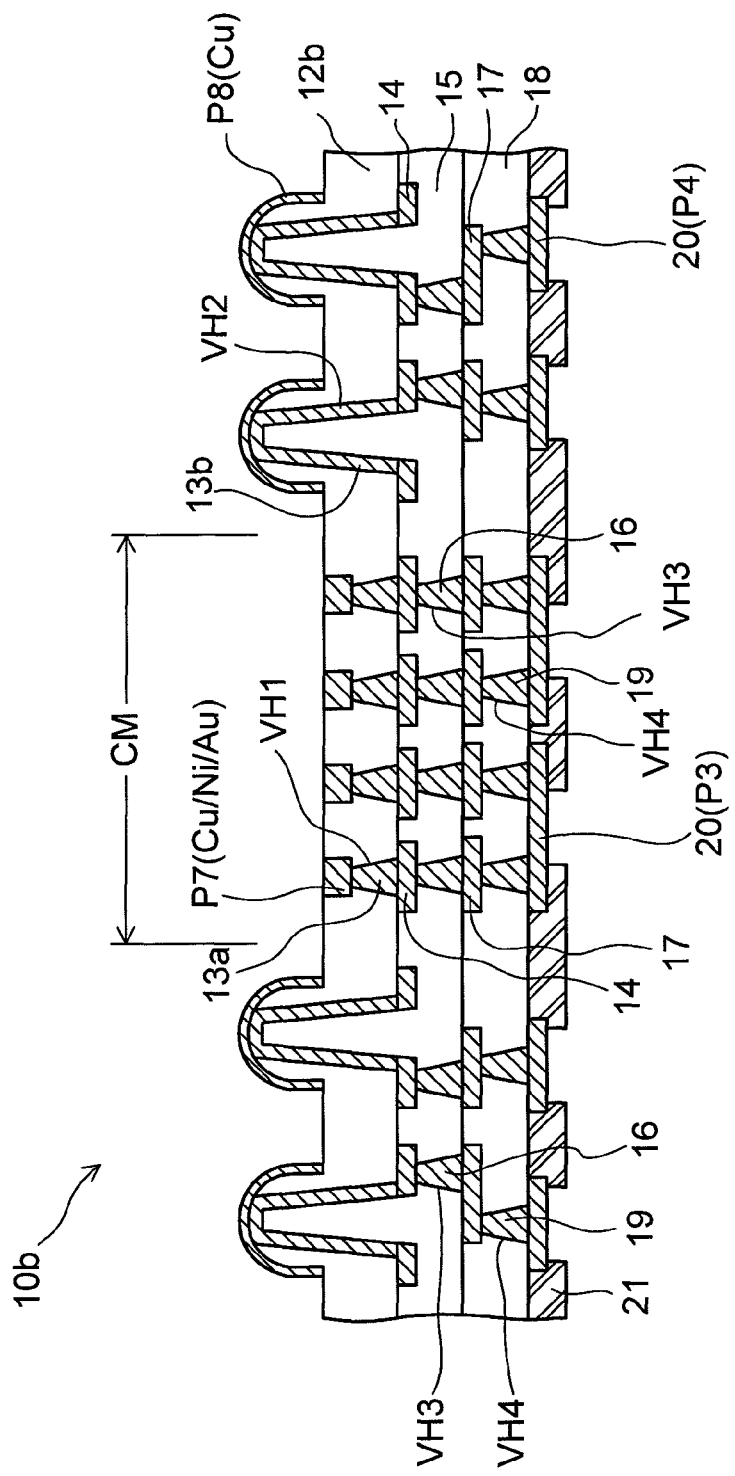
FIG. 10 is a cross-sectional view showing a configuration of a wiring board (semiconductor package) according to a third embodiment of the present invention.
Figure 11A:
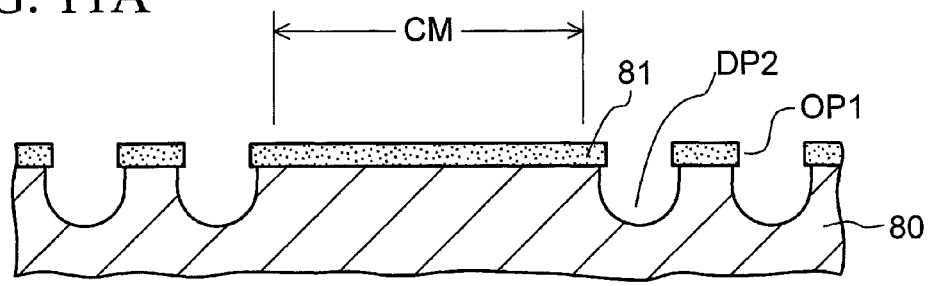
FIGS. 11A to 11C are cross-sectional views showing steps of a method of manufacturing the package shown in FIG. 10.
Figure 11B:
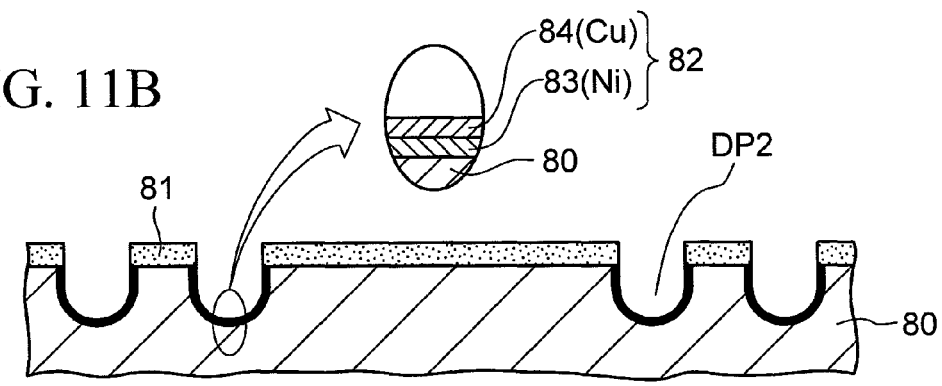
Figure 11C:
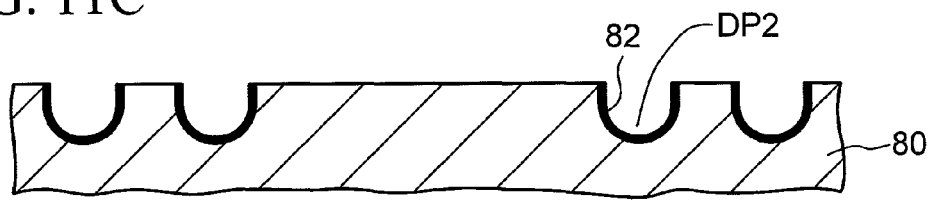
Figure 12A:
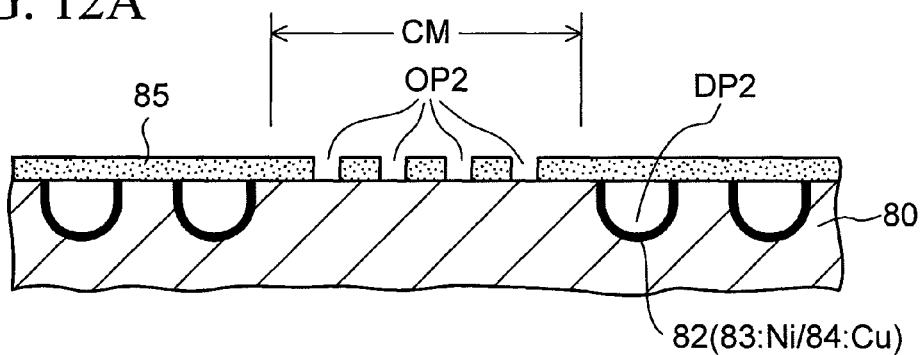
FIGS. 12A to 12C are cross-sectional views showing manufacturing steps subsequent to the steps in FIGS. 11A to 11C.
Figure 12B:
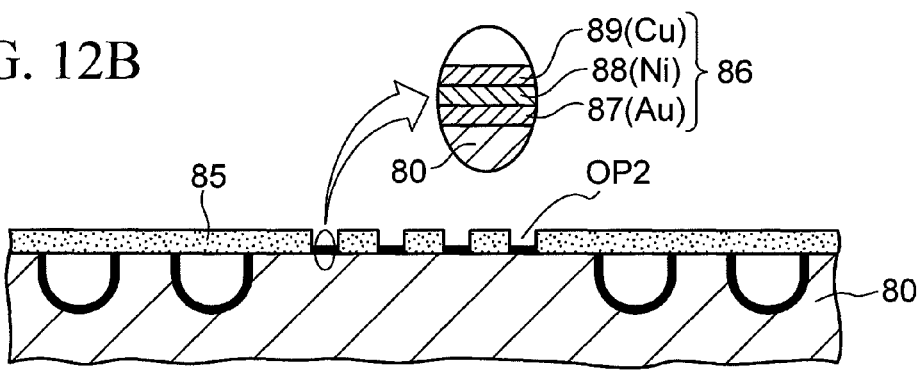
Figure 12C:
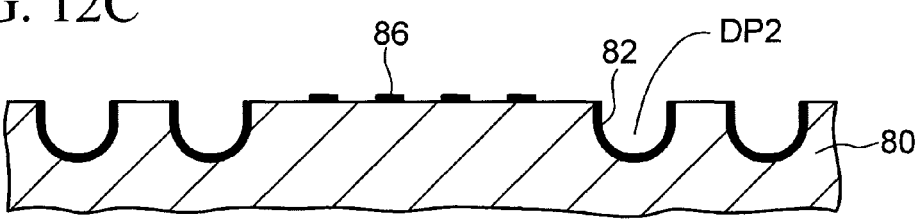

FIG. 10 shows a configuration of a wiring board (semiconductor package) according to the third embodiment of the present invention, in the form of a cross-sectional view.

As compared with the configuration of the wiring board 10 (FIG. 1) according to the first embodiment, a wiring board (semiconductor package) 10b according to the third embodiment is different in the following points. First, each of pads P7 arranged in the chip mounting area CM has a structure in which multiple metal layers are stacked one on top of another (for example, a Cu layer, Ni layer and Au layer in the order from the lower layer side), and the surfaces of the pads P7 are exposed and flush with the surface of the resin layer 12b. Second, each of pads P8 for POP bonding arranged in the peripheral region around the chip mounting area CM is formed of a single metal layer (Cu layer). Since the other configuration of the wiring board 10b is basically the same as that of the wiring board 10 of the first embodiment, the description thereof is omitted herein.

The wiring board (semiconductor package) 10b according to the present embodiment can be basically fabricated in the same manner as the processes performed in the steps (FIGS. 2A to 5C) of the manufacturing method according to the first embodiment. However, processing steps for forming the pads P7 exposed and flush with the surface of the resin layer 12b in the chip mounting area CM are needed, so that processes to be performed in the steps related to the processing steps is slightly different. FIGS. 11A to 12C show the related processing steps.

Hereinafter, a method of manufacturing the wiring board (semiconductor package) 10b according to the third embodiment is described with reference to FIGS. 11A to 12C and FIGS. 2A to 5C.

First, in the same manner as the processes performed in the steps in FIGS. 2A to 2D, a support base member 80 having the recessed portions DP2 at required positions is prepared. However, in the present embodiment, when half etching is performed in the step in FIG. 2C, each of the recessed portions DP2 is formed to have a "larger depth," as formed in the step in FIG. 3A, by extending the etching time.

In the next step (See FIG. 11A), in the same manner as the process performed in the step in FIG. 2E, a plating resist is formed by using a patterning material on the surface of the support base member 80 where the recessed portions DP2 are formed, and then a resist layer 81 is formed by patterning the plating resist in a required shape. Specifically, the resist layer 81 is patterned to have the opening portions OP1 according to the shape of the required pads P8 to be formed at corresponding portions around the chip mounting area CM.

In the next step (See FIG. 11B), in the same manner as the process performed in the step in FIG. 3B, a metal layer 82 having a two-layer structure is formed by electrolytic plating using the support base member 80 as a power feeding layer on the inner wall surface of the recessed portions DP2 of the support base member 80 exposed through the opening portions OP1 of the resist layer 81, respectively. Specifically, the metal layer 82 is obtained by forming a Ni layer 83 with a thickness of approximately 5 µm on the support base member (Cu) 80 by Ni plating first, and then forming a Cu layer 84 with a thickness of approximately 15 µm on the Ni layer 83 by copper Cu plating. The Ni layer 83, which is the lower layer of the metal layer 82, functions as a sacrifice conductive layer as in the aforementioned case, and is eventually subjected to etching. In addition, the Cu layer 84, which is the upper layer of the metal layer 82, remains eventually and forms the pads P8 for POP bonding (FIG. 10).

In the next step (See FIG. 11C), in the same manner as the process performed in the step in FIG. 3C, the plating resist (resist layer 81) is removed. Thereby, a structure in which the metal layer 82 having the two-layer structure (Ni layer 83/Cu layer 84) is formed on the inner wall surface of each of the recessed portions DP2 of the support base member 80 as illustrated is fabricated.

In the next step (See FIG. 12a), in the same manner as the process performed in the step in FIG. 2E, a plating resist is formed by using a patterning material on the surface of the support base member 80 where the recessed portions DP2 are formed, and then, a resist layer 85 is formed by patterning the plating resist in a required shape. The resist layer 85 is patterned to have the opening portions OP2 according to the shape of the required pads P7 to be formed at corresponding portions in the chip mounting area CM (i.e., to mask the portion of the metal layer 82 formed on the inner wall surface of each of the recessed portion DP2).

In the next step (See FIG. 12B), a metal layer 86 having a three-layer structure is formed by electrolytic plating using the support base member 80 as a power feeding layer on the support base member 80 exposed through the opening portions OP2 of the resist layer 85. For example, an Au layer 87 with a thickness of approximately 40 nm is formed on the support base member (Cu) 80 by Au flash plating, and then, a Ni layer 88 with a thickness of approximately 5 µm is formed on the Au layer 87 by Ni plating. Next, a Cu layer 89 with a thickness of approximately 15 µm is formed on the Ni layer 88 by Cu plating. Thereby, the metal layer 86 is formed. In this case, the Ni layer 88 is formed to prevent Cu contained in the metal layer 89, which is the upper layer thereof, from diffusing into the Au layer 87, which is the lower layer thereof.

Specifically, in this example, the metal layer 86 having the three-layer structure is formed by stacking the Au layer 87, the Ni layer 88 and the Cu layer 89 in this order. The metal layer 86 having the three-layer structure eventually remains and forms the pads P7 (FIG. 10) for mounting a chip. The composition of the metal layer forming the pads P7 is not limited to the Au/Ni/Cu layer as in the case of this example. As another example of the layer structure, Au/Pd/Ni/Cu, Au/Cu or the like may be stacked.

In the next step (See FIG. 12C), in the same manner as the process performed in the step in FIG. 3C, the plating resist (resist layer 85) is removed. In this manner, the following structure is fabricated. In this structure, as illustrated, the metal layer 82 having the two-layer structure (Ni layer 83/Cu layer 84) is formed on the inner wall surface of each of the recessed portions DP2 of the support base member 80, and the metal layer 86 having the three-layer structure (Au layer 87/Ni layer 88/Cu layer 89) is formed at the corresponding portions in the chip mounting area CM.

Thereafter, through the same process performed in each of the steps in FIGS. 3D to 5B, the wiring board 10b (FIG. 10) according to the present embodiment is obtained.

According to the third embodiment (FIGS. 10 to 12C), in addition to the effects obtained in the aforementioned first embodiment (FIGS. 1 to 7), simplification of the manufacturing steps can be achieved because the Sn layer 11b does not have to be formed in the last step (FIG. 5C) of the processing as in the case of the second embodiment.

(Other Embodiments)

In the aforementioned first embodiment (FIG. 1), the description is given of the example of the case where the two-layer structure obtained by stacking the Sn layer 11b on the Cu layer 11a is employed as the composition of the metal layer forming the pads P1 and P2. However, the Sn layer 11b on the exposed side does not have to be necessarily formed. As in the case of a pad provided in a general semiconductor package, the pad in which a Cu layer is exposed may be used.

The configuration of the wiring board (semiconductor package) in this case is equivalent to the configuration of the package 10 in FIG. 1 in which the Sn layer 11b on the outer side is removed from the pads P1 and P2, and thereby, the Cu layer 11a is exposed. In addition, since the Sn layer 11b is not provided, the aforementioned step in FIG. 5C can be omitted. Thus, this configuration contributes to simplification of the manufacturing steps.

Moreover, in the processing (FIGS. 2A to 5C) according to the aforementioned first embodiment, the description is given of the example of the case where nickel (Ni) is used in the step in FIG. 3B as a metal species removable "selectively" with respect to the other exposed components when the support base member (Cu) 60b is eventually subjected to etching, and the Ni layer 11c is formed as a sacrifice conductive layer. However, another metal species may be used as a matter of course.

For example, instead of performing Ni/Cu plating in the step in FIG. 3B, a metal layer having a three-layer structure may be formed by performing Au plating, Ni plating and Cu plating in this order on the inner wall surfaces of the recessed portions DP2 and DP3 of the support base member 60b by electrolytic plating using the support base member 60b as a power feeding layer, for example, the recessed portions DP2 and DP3 of the support base member 60b exposed through the opening portions of the resist layer 62, respectively. When the plating film having the aforementioned layer structure is formed, the Au layer, which is the lowermost layer, is not removed when the support base member 60b is subjected to etching eventually, and remains without being processed. Thus, the Au layer can be used as the uppermost metal layer (Au layer) of the bump shaped pads P1 and P2. In addition, since the sacrifice conductive layer (Ni layer 11c) as formed in the first embodiment is not formed, the process (the step in FIG. 5B) for removing the sacrifice conductive layer is no longer needed. This advantage contributes to simplification of the manufacturing steps. Note that, in the present embodiment as well, other than Au/Ni/Cu, Au/Pd/Ni/Cu, Au/Cu or the like can be used as the composition of the metal layer forming the pads P1 and P2.

What is claimed is:

1. A wiring board having a structure in which a plurality of wiring layers are stacked one on top of another with insulating layers each interposed between corresponding two of the wiring layers, and the plurality of the wiring layers are connected to each other through vias formed in the insulating layers, the wiring board comprising:
   a first pad which is arranged in a peripheral region around an electronic component mounting area of an outermost insulating layer on one of both surfaces of the wiring board, which is connected to a corresponding one of the vias that are formed on inner wall surfaces of corresponding via holes, and which is formed in a bump shape to cover a surface of a portion of the outermost insulating layer, the portion being formed to protrude;
   a second pad which is arranged in the electronic component mounting area, which is connected to a corresponding one of the vias which are made of metal and filled in corresponding via holes, and a surface of which is exposed from the outermost insulating layer; and
   an insulating layer underlying the outermost insulating layer, which is filled in the via holes with the vias connecting to the first pad; wherein
   the second pad is formed in a bump shape to cover a surface of a portion of the outermost insulating layer, the portion being formed to protrude,
   the second pad is formed in such a manner that the apex of the surface thereof is positioned lower than a position of the apex of the surface of the first pad; and
   the first pad and the second pad are on a same outer surface of the outermost insulating layer, which lies at a single level.

2. The wiring board according to claim 1, wherein the second pad is provided in such a manner that the surface thereof is exposed at a position recessed from the surface of the outermost insulating layer to an inner side of the board.

3. The wiring board according to claim 1, wherein the second pad is provided in a manner that the surface thereof is exposed and flush with the surface of the outermost insulating layer.

4. The wiring board according to claim 1, wherein each of the first and second pads includes a structure in which a plurality of metal layers are stacked one on top of another.

5. The wiring board according to claim 1, further comprising:
   another wiring board being mounted on the first pad; and
   a semiconductor element being mounted on the second pad.

6. A method of manufacturing a wiring board, comprising:
   forming a first resist layer on a support base material, the first resist layer being patterned to have an opening portion, in a manner to leave a portion corresponding to an electronic component mounting area, the opening portion corresponding to a shape of a first pad to be formed at a corresponding portion in a peripheral region around the electronic component mounting area;
   forming a support base member having a recessed portion by removing a required amount of a portion of the support base material, the portion being exposed through the opening portion of the first resist layer;
   forming, after removing the first resist layer, a second resist layer on a surface of the support base member where the recessed portion is formed, the second resist layer being patterned to have a first opening portion according to a shape of a second pad to be formed at the portion corresponding to the electronic component mounting area, and to have a second opening portion at a portion corresponding to the recessed portion;
   forming a plurality of metal layers respectively on portions of the support base member and on an inner wall surface of the recessed portion in the support base member, the portions and the recessed portion being exposed through the first and second opening portions of the second resist layer;
   forming, after removing the second resist layer, an insulating layer on a surface of the support base member where the metal layers are formed, in such a manner that a portion of each of the metal layers is exposed;
   forming a wiring layer on the insulating layer, the wiring layer including vias connected to the metal layers, respectively; and
   alternately stacking a required number of insulating layers and wiring layers and removing the support base member; wherein
   the second pad is formed in a bump shape to cover a surface of a portion of the outermost insulating layer, the portion being formed to protrude,
   the second pad is formed in such a manner that the apex of the surface thereof is positioned lower than a position of the apex of the surface of the first pad; and
   the first pad and the second pad are on a same outer surface of the outermost insulating layer, which lies at a single level.

7. The method of manufacturing a wiring board, according to claim 6, further comprising an etching step after the second resist layer is formed.

8. The method of manufacturing a wiring board, according to claim 6, further comprising a step of removing an outermost layer of each of the plurality of the metal layers.

9. A method of manufacturing a wiring board, comprising:
   forming a first resist layer on a support base material, the first resist layer being patterned to have an opening portion, in a manner to leave a portion corresponding to an electronic component mounting area, the opening portion corresponding to a shape of a first pad to be formed at a corresponding portion in a peripheral region around the electronic component mounting area;
   forming a support base member having a recessed portion by removing a required amount of a portion of the support base material, the portion being exposed through the opening portion of the first resist layer;
   forming, after removing the first resist layer, a second resist layer on a surface of the support base member where the recessed portion is formed, the second resist layer being patterned to have opening portions at a portion corresponding to the recessed portion;

forming a plurality of metal layers on an inner wall surface of the recessed portion of the support base member exposed through the opening portion of the second resist layer;

forming, after removing the second resist layer, a third resist layer on a surface of the support base member where the metal layers are formed, the third resist layer being patterned to have an opening portion according to a shape of a second pad to be formed at a corresponding portion in the electronic component mounting area;

stacking a plurality of metal films constituting the second pad on the support base member exposed through the opening portion of the third resist layer;

forming, after removing the third resist layer, an insulating layer on a surface of the support base member where the metal layers are formed in such a manner that a portion of each of the metal layers is exposed;

forming a wiring layer on the insulating layer, the wiring layer including vias connected to the metal layers and the metal films, respectively; and alternately stacking a required number of insulating layers and wiring layers and removing the support base member; wherein the second pad is formed in a bump shape to cover a surface of a portion of the outermost insulating layer, the portion being formed to protrude, the second pad is formed in such a manner that the apex of the surface thereof is positioned lower than a position of the apex of the surface of the first pad; and the first pad and the second pad are on a same outer surface of the outermost insulating layer, which lies at a single level.

10. The method of manufacturing a wiring board, according to claim 9, further comprising a step of removing an outermost layer of each of the plurality of the metal layers.

* * * * *